United States Patent
Kawabata

(10) Patent No.: US 9,197,191 B2
(45) Date of Patent: Nov. 24, 2015

(54) HOWLING SUPPRESSION DEVICE AND ADAPTIVE NOTCH FILTER

(71) Applicant: Oki Electric Industry Co., Ltd., Tokyo (JP)

(72) Inventor: Naoya Kawabata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 334 days.

(21) Appl. No.: 13/946,318

(22) Filed: Jul. 19, 2013

(65) Prior Publication Data

US 2014/0059103 A1 Feb. 27, 2014

(30) Foreign Application Priority Data

Aug. 21, 2012 (JP) ................. 2012-182450

(51) Int. Cl.
*H03H 21/00* (2006.01)
*H03H 9/46* (2006.01)

(52) U.S. Cl.
CPC ............. *H03H 9/46* (2013.01); *H03H 21/0021* (2013.01)

(58) Field of Classification Search
CPC .................................................. H03H 21/0021
See application file for complete search history.

(56) References Cited

U.S. PATENT DOCUMENTS

| | | | |
|---|---|---|---|
| 5,724,657 A * | 3/1998 | Lin et al. ...................... 455/423 |
| 5,734,577 A * | 3/1998 | Chesir et al. .................. 342/159 |
| 2010/0312365 A1* | 12/2010 | Levin et al. ..................... 700/37 |
| 2011/0206226 A1* | 8/2011 | Pandey et al. ................. 381/317 |

OTHER PUBLICATIONS

Masaki Kobayashi et al., "A Study on an Algorithm and a Convergence Performance for Adaptive Notch Filter Utilizing and Allpass Filter", Transactions of the Institute of Electronics, Information and Communication Engineers. A. vol. J82-A No. 3 pp. 325-332. Mar. 1999.

* cited by examiner

*Primary Examiner* — Chuong D Ngo
(74) *Attorney, Agent, or Firm* — Rabin & Berdo, P.C.

(57) ABSTRACT

An adaptive notch filter adaptively modifies one or more notch frequencies. The adaptive notch filter includes a transfer function equivalent to coupling j stages (where j is a natural number equal to or greater than 1) of adaptive notch filter units each having a transfer function $H_j(z)$ expressed by a predetermined equation and having a different notch frequency.

3 Claims, 6 Drawing Sheets

HOWLING SUPPRESSION DEVICE AND ADAPTIVE NOTCH FILTER

CROSS REFERENCE TO RELATED APPLICATION(S)

This application is based upon and claims benefit of priority from Japanese Patent Application No. 2012-182450, filed on Aug. 21, 2012, the entire contents of which are incorporated herein by reference.

BACKGROUND

The present invention relates to a howling suppression device and a howling suppression device program as well as an adaptive notch filter and an adaptive notch filter program, and is applicable to an audio receiving device in a speakerphone system for videoconferencing or audio conferencing, for example.

In a speakerphone system for videoconferencing or audio conferencing, etc., sounds (such as audio and voices) output from a speaker is fed back into a microphone, producing acoustic echoes that return back to a transmitting side. Furthermore, if the gain of a feedback system is 1 or more, the system enters an oscillating state (so-called howling). Since howling significantly impedes call, much research and development on howling suppression methods has been conducted heretofore.

As one approach to suppress the howling, there is a method that uses an adaptive notch filter. A notch filter is a filter that removes (attenuates) a specific frequency, while an adaptive notch filter is a filter that adaptively updates filter coefficients to form a notch (rejection frequency). By applying an adaptive notch filter in a howling suppression device and updating the filter coefficient of the adaptive notch filter, it is possible to adaptively suppress a howling frequency. An adaptive notch filter applicable to a howling suppression device is proposed in "A Study on an Algorithm and a Convergence Performance for Adaptive Notch Filter Utilizing an Allpass Filter", M. Kobayashi, T. Akagawa, Y. Itoh, IEEE Trans., Vol. J82-A, No. 3, pp. 325-332, March 1999 (hereinafter referred to as "Non-Patent Document 1").

The adaptive notch filter proposed in Non-Patent Document 1 removes a specific frequency by calculating and updating an update amount of the filter coefficient that determines the rejection frequency. The update amount of the filter coefficient to determine the rejection frequency is calculated from an input signal of the adaptive filter and the coefficient in the denominator of a transfer function of the adaptive filter.

SUMMARY

However, with the adaptive notch filter proposed in Non-Patent Document 1, the adaptable parameter is only the rejection frequency, and it is necessary to set the notch bandwidth in advance. Since the howling characteristics differ according to factors such as the shape of a room, if the notch bandwidth of the adaptive notch filter is left at the default settings, sufficient howling suppression performance might not be obtained in some cases with a howling suppression device applying that adaptive notch filter. A separate update formula is required in order to adapt the notch bandwidth. However, there has been a problem in that convergence of the adaptive notch filter is not guaranteed due to separately updating the frequency and the bandwidth.

In light of the foregoing, it is desirable to provide a howling suppression device and a howling suppression program that can suppress howling even when the notch bandwidth is not a constant bandwidth.

It is further desirable to provide an adaptive notch filter and an adaptive notch filter program that can correspond to a change in one or more notch frequencies (the notch bandwidth is not limited to a constant bandwidth).

According to a first aspect of the present invention, there is provided an adaptive notch filter that can adaptively modify one or more notch frequencies, the adaptive notch filter including: a transfer function equivalent to coupling j stages (where j is a natural number equal to or greater than 1) of adaptive notch filter units each having a transfer function $H_f(z)$ expressed by an equation A1 below and having a different notch frequency.

$$H_f(z) = \frac{1 + b_1(n)z^{-1} + z^{-2}}{1 + b_1(n)\sqrt{a_2(n)}\,z^{-1} + a_2(n)z^{-2}} \quad \text{(A1)}$$

$$a_2(n+1) = a_2(n) - \mu \cdot \Delta_{a2} \quad \text{(A2)}$$

$$b_1(n+1) = b_1(n) + \mu \cdot \Delta_{b1} \quad \text{(A3)}$$

In the equation A1, n is time, and $a_2(n)$ and $b_1(n)$ are filter coefficients updated according to an equation A2 and an equation A3, respectively. The filter coefficient $a_2(n)$ is a filter coefficient related to a notch bandwidth. In the equation A2 and the equation A3, $\mu$ is a step gain, and $\Delta_{a2}$ and $\Delta_{b1}$ are filter coefficient update amounts calculated according to respective filter coefficient update algorithms.

According to a second aspect of the present invention, there is provided a howling suppression device that suppresses one or more howling frequencies by utilizing an adaptive notch filter unit that includes an adaptive notch filter and a filter coefficient controller, the howling suppression device including: the adaptive notch filter according to the above-described first aspect as the adaptive notch filter.

According to an aspect of the present invention, it is possible to provide an adaptive notch filter and an adaptive notch filter program that can remove a frequency having a wide bandwidth, without setting the notch bandwidth in advance.

According to another aspect of the present invention, it is possible to provide a howling suppression device and a howling suppression program that can suppress a howling frequency having a wide bandwidth, without setting the notch bandwidth in advance.

DETAILED DESCRIPTION OF THE EMBODIMENT(S)

Figure 1:
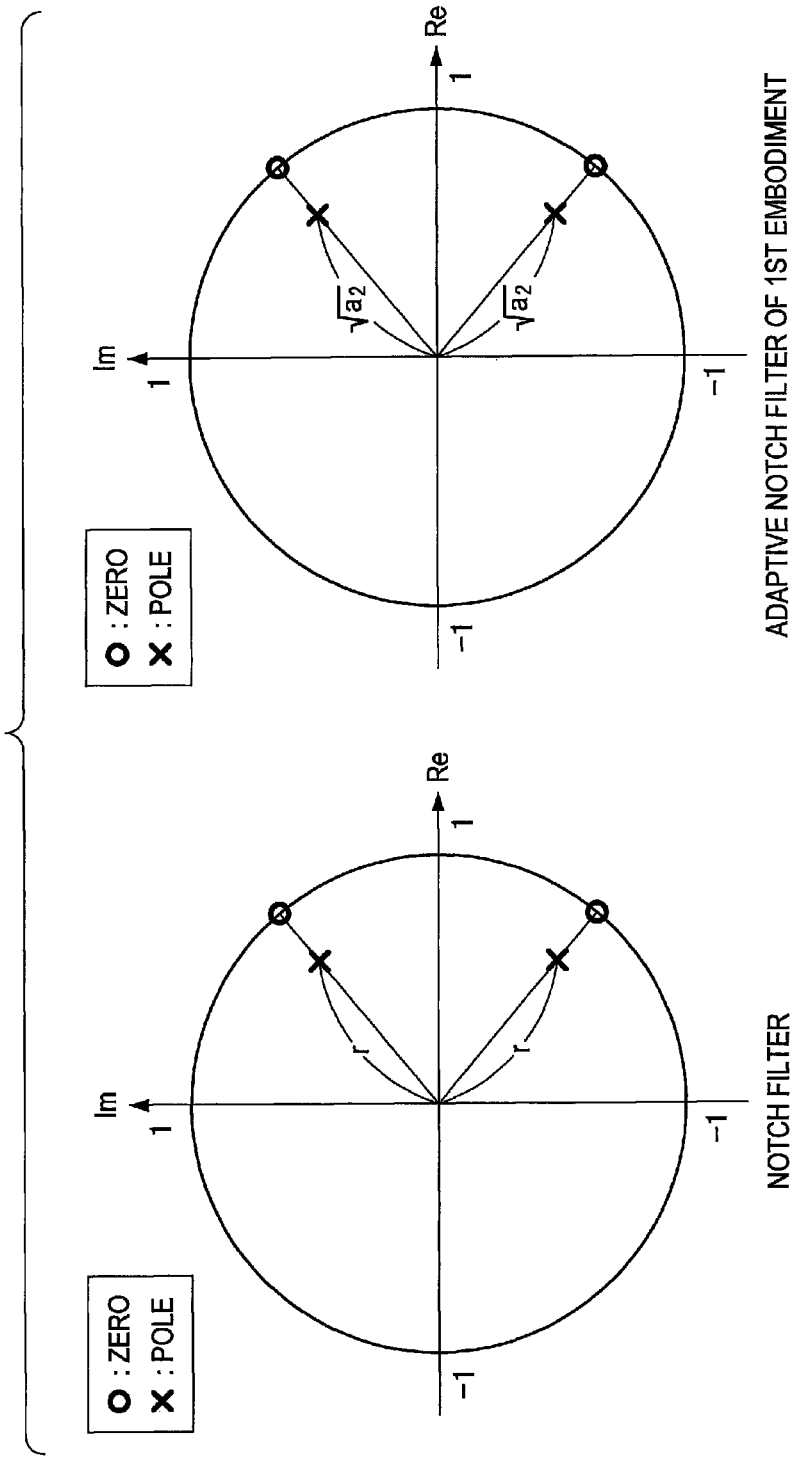
FIG. 1 is an explanatory diagram illustrating pole-zero plots of a transfer function of an adaptive notch filter according to a first embodiment and a notch filter of the related art.

Hereinafter, referring to the appended drawings, preferred embodiments of the present invention will be described in detail. It should be noted that, in this specification and the appended drawings, structural elements that have substantially the same function and structure are denoted with the same reference numerals, and repeated explanation thereof is omitted.

Before describing the howling suppression devices according to a first embodiment and a second embodiment, an adaptive notch filter according to an embodiment of the present invention that is applied to these devices according to these embodiments will be described. First, an adaptive notch filter according to the first embodiment will be described, and then an adaptive notch filter (a multi-stage adaptive notch filter) according to the second embodiment will be described.

(A) Adaptive Notch Filter According to First Embodiment

A transfer function $H_{Notch}(z)$ of a conventional notch filter of the related art is expressed in Equation (1). In Equation (1), f is a notch frequency, fs is a sampling frequency, and r is a parameter that determines a notch bandwidth. The notch frequency f corresponds to a howling frequency in the case of applying an adaptive notch filter to a howling suppression device.

$$H_{Notch}(z) = \frac{1 - 2\cos(2\pi f/fs) \cdot z^{-1} + z^{-2}}{1 - 2r\cos(2\pi f/fs) \cdot z^{-1} + r^2 \cdot z^{-2}} \quad (1)$$

The transfer functions for the adaptive notch filters according to the first and second embodiments have been newly proposed by the inventor of the present invention in consideration of the transfer function $H_{Notch}(z)$ in Equation (1).

The structure of Equation (1) demonstrates that a notch filter having the transfer function $H_{Notch}(z)$ is a filter of an infinite impulse response (IIR) type. Meanwhile, a transfer function $H_{IIR}(z)$ of a conventional IIR adaptive filter is expressed in Equation (2). Equation (2) is disclosed in Cited Literature 1 (http://www.lss.uni-stuttgart.de/matlab/notch/index.en.html) and Cited Literature 2 (http://triplecorrelation.com/courses/fundsp/iirdesign.pdf). In Equation (2), n is time, and $a_1(n)$, $a_2(n)$, $b_0(n)$, $b_1(n)$, and $b_2(n)$ are filter coefficients of the IIR adaptive filter.

$$H_{IIR}(z) = \frac{b_0(n) + b_1(n) \cdot z^{-1} + b_2(n) \cdot z^{-2}}{1 + a_1(n) \cdot z^{-1} + a_2(n) \cdot z^{-2}} \quad (2)$$

At this point, Equations (3) to (7) are derived from comparing the coefficients of the transfer function $H_{Notch}(z)$ indicated in Equation (1) with the coefficients of the transfer function $H_{IIR}(z)$ indicated in Equation (2), and Equation (8) for $a_1(n)$ is derived from Equation (3), Equation (4), and Equation (6).

$$a_1(n) = -2r\cos(2\pi f/fs) \quad (3)$$

$$a_2(n) = r^2 \quad (4)$$

$$b_0(n) = 1 \quad (5)$$

$$b_1(n) = -2\cos(2\pi f/fs) \quad (6)$$

$$b_2(n) = 1 \quad (7)$$

$$a_1(n) = b_1(n)\sqrt{a_2(n)} \quad (8)$$

These formulas demonstrate that the transfer function $H_{IIR}(z)$ of an IIR adaptive filter indicated in Equation (2) can be derived as the transfer function of a notch filter by setting the coefficients of the constant term and the $z^{-2}$ term in the numerator of the transfer function $H_{IIR}(z)$ of the IIR adaptive filter indicated in Equation (2) (i.e., $b_0(n)$ and $b_2(n)$) to 1, adaptively updating the coefficients related to the notch frequency and the notch bandwidth (i.e., $b_1(n)$ and $a_2(n)$), and obtaining a1(n) by using the updated $b_1(n)$ and $a_2(n)$. The notch filter in this case becomes an adaptive notch filter, and the transfer function $H_f(z)$ of this adaptive notch filter is expressed in Equation (9). In Equation (9), n is time, and $a_2(n)$ and $b_1(n)$ are the filter coefficients of the adaptive notch filter. These filter coefficients are expressed in Equation (10) and Equation (11), respectively. In Equation (10) and Equation (11), μ is the step gain, and $\Delta_{a2}$ and $\Delta_{b1}$ are the filter coefficient update amounts.

$$H_f(z) = \frac{1 + b_1(n)z^{-1} + z^{-2}}{1 + b_1(n)\sqrt{a_2(n)}\, z^{-1} + a_2(n)z^{-2}} \quad (9)$$

$$a_2(n+1) = a_2(n) - \mu \cdot \Delta_{a2} \quad (10)$$

$$b_1(n+1) = b_1(n) + \mu \cdot \Delta_{b1} \quad (11)$$

The filter coefficient update amounts $\Delta_{a2}$ and $\Delta_{b1}$ can be calculated using a filter coefficient update algorithm (such as a least squares error algorithm or a simple hyperstable adaptive recursive filter (SHARF) algorithm). Equation (12) and Equation (13) respectively indicate the case of computing the filter coefficient update amounts $\Delta_{a2}$ and $\Delta_{b1}$ using a SHARF algorithm. Note that in Equation (12) and Equation (13), x(n) is an input signal into the adaptive notch filter at time n, and y(n) is an output signal from the adaptive notch filter at the time n.

$$\Delta_{a2} = y(n-2)y(n) \quad (12)$$

$$\Delta_{b1} = x(n-1)y(n) \quad (13)$$

An adaptive notch filter according to the first embodiment (see FIG. 3 discussed later) has the transfer function $H_f(z)$ indicated in Equation (9), to which are applied the coefficients $a_2(n)$ and $b_1(n)$ related to the notch bandwidth and the notch frequency that are adaptively updated according to Equation (10) and Equation (11).

Note that a filtering process applying the transfer function $H_f(z)$ indicated in Equation (9) can also be realized by having a CPU execute a program that executes the calculation of the transfer function $H_f(z)$ indicated in Equation (9), for example.

According to the first embodiment, it is possible to provide an adaptive notch filter that can remove (attenuate) a notch frequency even if the notch bandwidth is not a predetermined width.

Also, according to the first embodiment, it is possible to provide an adaptive notch filter having zeros and poles at the same places as a notch filter of the related art having the transfer function indicated in Equation (1). Moreover, the adaptive notch filter can be constructed as a stable filter. The following will describe the reasons why these advantages are exhibited.

Checking the zero of the transfer function $H_f(z)$ indicated in Equation (9) derives Equation (14) indicating that the numerator is 0, from the fact that the zero of the transfer function $H_f(z)$ is a point where $H_f(z)$ equals 0. Solving the equation indicated in Equation (14) derives Equation (15), and calculating the norm of $z_{zero}$ ($|z_{zero}|$) on the basis of Equation (15) derives Equation (16).

$$1 + b_1(n)z^{-1} + z^{-2} = 0 \quad (14)$$

$$z_{zero} = \frac{-b_1(n) \pm i\sqrt{4-b_1(n)^2}}{2} \quad (15)$$

$$|z_{zero}| = \left|\frac{-b_1(n) \pm i\sqrt{4-b_1(n)^2}}{2}\right| \quad (16)$$

$$= \sqrt{\left(\frac{b_1(n)}{2}\right)^2 + \left(\frac{\sqrt{4-b_1(n)^2}}{2}\right)^2}$$

$$= 1$$

$|z_{zero}|=1$ indicated in Equation (16) indicates that zeros are on a unit circle in the z plane. Also, since the z-transform on a unit circle in the z plane represents frequency characteristics, zeros are produced on a unit circle in the z plane by setting the coefficients of the constant term and the $z^{-2}$ term in the numerator to 1, demonstrating that the frequency characteristics of the transfer function $H_f(z)$ indicated in Equation (9) are able to produce a notch at a given frequency.

In addition, the pole of the transfer function $H_f(z)$ derives Equation (17) indicating that the denominator is 0, from the fact that a pole of the transfer function $H_f(z)$ is a point where the denominator of $H_f(z)$ equals 0. Solving the equation indicated in Equation (17) yields Equation (18).

$$1 + b_1(n)\sqrt{a_2(n)}\, z^{-1} + a_2(n)z^{-2} = 0 \quad (17)$$

$$z_{pole} = \frac{-b_1(n)\sqrt{a_2(n)} \pm i\sqrt{4a_2(n) - b_1(n)^2 a_2(n)}}{2} \quad (18)$$

$$= \sqrt{a_2(n)}\, z_{zero}$$

Equation (18) indicates that poles are positioned at the $\sqrt{\{a_2(n)\}}$ multiples of the zero $z_{zero}$. Here, FIG. 1 illustrates the zeros and poles in Equation (1) and Equation (9) in the z plane, demonstrating that poles exist at the severalfold position of a zero in the transfer functions indicated in Equation (1) and Equation (9). In other words, an adaptive notch filter according to the first embodiment is an adaptive notch filter having poles on the straight lines joining the origin of the z plane and the zeros, similarly to a notch filter of the related art having the transfer function indicated in Equation (1).

Also, since a filter is stable if the poles of its transfer function exist inside a unit circle, FIG. 1 demonstrates that by having $a_2(n)$ take a value within the range $0<a_2(n)<1$, the adaptive notch filter according to the first embodiment becomes a stable filter.

(B) Adaptive Notch Filter According to Second Embodiment

Next, an adaptive notch filter according to the second embodiment of the present invention will be described. The adaptive notch filter according to the second embodiment is a filter (a multi-stage adaptive notch filter) in which the adaptive notch filters of the first embodiment discussed above are cascaded in multiple stages.

Figure 2:
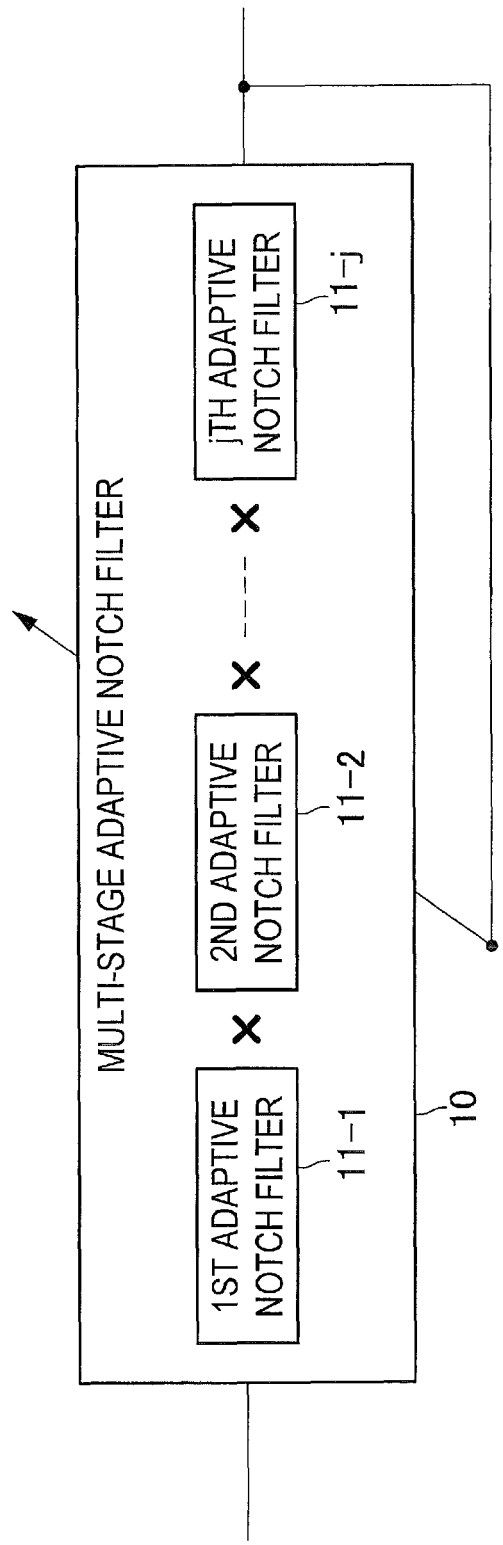
FIG. 2 is a block diagram illustrating an exemplary detailed configuration of an adaptive notch filter (multi-stage adaptive notch filter) according to a second embodiment.

FIG. 2 is a block diagram illustrating an exemplary detailed configuration of an adaptive notch filter (multi-stage adaptive notch filter) according to the second embodiment.

As illustrated in FIG. 2, an adaptive notch filter (multi-stage adaptive notch filter) 10 of the second embodiment is constructed as a single adaptive notch filter by cascading adaptive notch filters 11-1 to 11-j (where j is an integer equal to or greater than 2) with different notch frequencies to form a single notch filter, and by updating the filter coefficient of each of the adaptive notch filters 11-1 to 11-j. This enables the removal of multiple frequencies by applying adaptive notch filters with the transfer function indicated in Equation (9).

Each of the adaptive notch filters 11-1 to 11-j may also be configured in hardware and cascaded in multiple stages. It is also possible to execute the multi-stage coupling of the adaptive notch filters 11-1 to 11-j in software. In this case, the respective adaptive notch filters 11-1 to 11-j may be stated as different processing routines (programs) and configured such that the processing of each processing routine is sequentially executed. Alternatively, a single processing routine integrating the respective adaptive notch filters 11-1 to 11-j may be stated and configured to realize the multi-stage coupling of the adaptive notch filters 11-1 to 11-j. Hereinafter, the latter case will be described.

The multi-stage coupling of the adaptive notch filters 11-1 to 11-j can be realized in integrated software by taking the multiplicative product of the respective transfer functions of the adaptive notch filters 11-1, . . . , 11-j as the transfer characteristics. By multiplying the transfer functions, the multi-stage adaptive notch filter 10 becomes a notch filter with a long filter length, and when the number of adaptive notch filters is greater than the number of notch frequencies, the filter coefficients converge to become a sharp notch.

Note that the multi-stage adaptive notch filter 10 of the second embodiment is not limited to being configured as a multi-stage coupling of the adaptive notch filters 11-1 to 11-j, and it is sufficient for the multi-stage adaptive notch filter 10 to have the same transfer function as the case of coupling adaptive notch filters 11-1 to 11-j in multiple stages.

The relationship between an input X(z) and an output Y(z) of the multi-stage adaptive notch filter 10 illustrated in FIG. 2, when expressed using the respective transfer functions of the adaptive notch filters 11-1, . . . , 11-j, is indicated in Equation (19). In Equation (19), $H_k(z)$ (where k=1, 2, . . . , j) is the transfer function of each adaptive notch filter 11-1, . . . , 11-j, X(z) is the Z-transform of an input signal into the multi-stage adaptive notch filter 10, Y(z) is the Z-transform of an output signal from the multi-stage adaptive notch filter 10, and j is the number of adaptive notch filters constituting the multi-stage adaptive notch filter 10. For example, when j=4, the multi-stage adaptive notch filter 10 becomes a filter that removes a maximum of four different frequencies.

$$Y(z) = (H_j(z) \cdot (H_{j-1}(z) \cdot ( \ldots H_3(z) \cdot (H_2(z) \cdot (H_1(z) \cdot X(z))) \ldots )) \quad (19)$$

$$= H_j(z) \cdot H_{j-1}(z) \ldots H_3(z) \cdot H_2(z) \cdot H_1(z) \cdot X(z)$$

$$= \left(\prod_{k=1}^{j} H_k(z)\right) \cdot X(z)$$

The transfer function of the multi-stage adaptive notch filter 10 formed as a single adaptive notch filter by coupling the adaptive notch filters 11-1, ..., 11-*j* in multiple stages can be expressed in Equation (20) by substituting the relevant portion of Equation (19) into the transfer function in Equation (9) and organizing terms. The term $a_0$ in Equation (20) is expressed in Equation (21). Equation (20) is calculated by treating the adaptive notch filters 11-1, ..., 11-*j* as having the same notch bandwidth. In Equation (20) and Equation (21), n is time, $a_2(n)$ and $b_1(k, n)$ (where k=1, 2, ..., j) are the filter coefficients of each of the adaptive notch filters 11-1, ..., 11-*j*, and $a(n)$ and $b_i(n)$ (where i=1, 2, ..., 2j-1) are the filter coefficients of the multi-stage adaptive notch filter 10 that removes a plurality of frequencies. Updates for these filter coefficients are executed according to Equation (22) and Equation (23), respectively. In Equation (22) and Equation (23), μ is a step gain, while $\Delta_a$ and $\Delta_{bi}$ (where i=1, 2, ..., 2j-1) are the filter coefficient update amounts.

$$\prod_{k=1}^{j} H_k(z) = \prod_{k=1}^{j} \left( \frac{1 + b_1(k,n)z^{-1} + z^{-2}}{1 + b_1(k,n)\sqrt{a_2(k,n)}\, z^{-1} + a_2(n)z^{-2}} \right) \quad (20)$$

$$= \frac{1 + b_1(n)\cdot z^{-1} + \ldots + b_{2j-1}(n)z^{-(2j-1)} + z^{-2j}}{1 + a_0 b_1(n)\cdot z^{-1} + a_0^2 b_2(n)z^{-2}\, \ldots\, + a_0^{2j-1} b_{2j-1}(n)z^{-(2j-1)} + a(n)z^{-2j}}$$

$$a_0 = \sqrt[2j]{a(n)} \quad (21)$$

$$a(n+1) = a(n) - \mu \cdot \Delta_a \quad (22)$$

$$b_i(n+1) = b_i(n) + \mu \cdot \Delta_{bi} \; (i=1, 2, \ldots, 2j-1) \quad (23)$$

The filter coefficient update amounts $\Delta_a$ and $\Delta_{bi}$ (where i=1, 2, ..., 2j-1) can be calculated using a filter coefficient update algorithm. Equation (24) and Equation (25) respectively indicate the case of computing the filter coefficient update amounts $\Delta_a$ and $\Delta_{bi}$ using a SHARF algorithm. Note that in Equation (24) and Equation (25), x(n) is an input signal into the multi-stage adaptive notch filter 10 at time n, while y(n) is an output signal from the multi-stage adaptive notch filter 10 at time n.

$$\Delta_a = y(n-2j)y(n) \quad (24)$$

$$\Delta_{bi} = x(n-j)y(n)(i=1,2,\ldots,2j-1) \quad (25)$$

Equation (20) above demonstrates that the constant term in the denominator, and the constant term and the highest-order filter coefficient in the numerator are each 1. This demonstrates that by setting the filter coefficient of the constant term in the denominator and the constant term and the highest-order z in the numerator to 1, updating the filter coefficient of the highest-order term in the denominator and all filter coefficients other than the constant term and the highest-order z term in the numerator, and computing all filter coefficients other than the constant term and the highest-order term in the denominator from the updated filter coefficients in the numerator, the multi-stage adaptive notch filter 10 becomes an adaptive notch filter that suppresses a plurality of frequencies.

Equation (26) is derived by substituting Equation (20) and Equation (21) into Equation (19) and then converting the formula from the z plane to the time axis. In Equation (26), n is time, x(n) is an input signal into the multi-stage adaptive notch filter 10, and y(n) is an output signal from the multi-stage adaptive notch filter 10.

$$y(n) = x(n) + \left( \sum_{i=1}^{2j-1} b_i(n)x(n-i) \right) + x(n-2j) - \left( \sum_{i=1}^{2j-1} (a_0(n))^i b_i(n) y(n-i) \right) - a(n)y(n-2j) \quad (26)$$

By having the transfer function indicated in Equation (20), the multi-stage adaptive notch filter 10 can suppress a plurality of frequencies each having a bandwidth. In the case of applying the multi-stage adaptive notch filter 10 to a howling suppression device, it is possible to appropriately suppress howling in an environment where a plurality of frequencies each having a bandwidth are howling by adaptively updating the filter coefficients of the multi-stage adaptive notch filter 10 so as to suppress the howling frequencies.

(C) Howling Suppression Device According to First Embodiment

Next, a howling suppression device according to the first embodiment of the present invention will be described with reference to the drawings.

The howling suppression device of the first embodiment implements the adaptive notch filter of the first embodiment discussed earlier, and conducts an adaptive notch filter process on an input signal to suppress a howling frequency.

(C-1) Configuration of Howling Suppression Device According to First Embodiment

Figure 3:
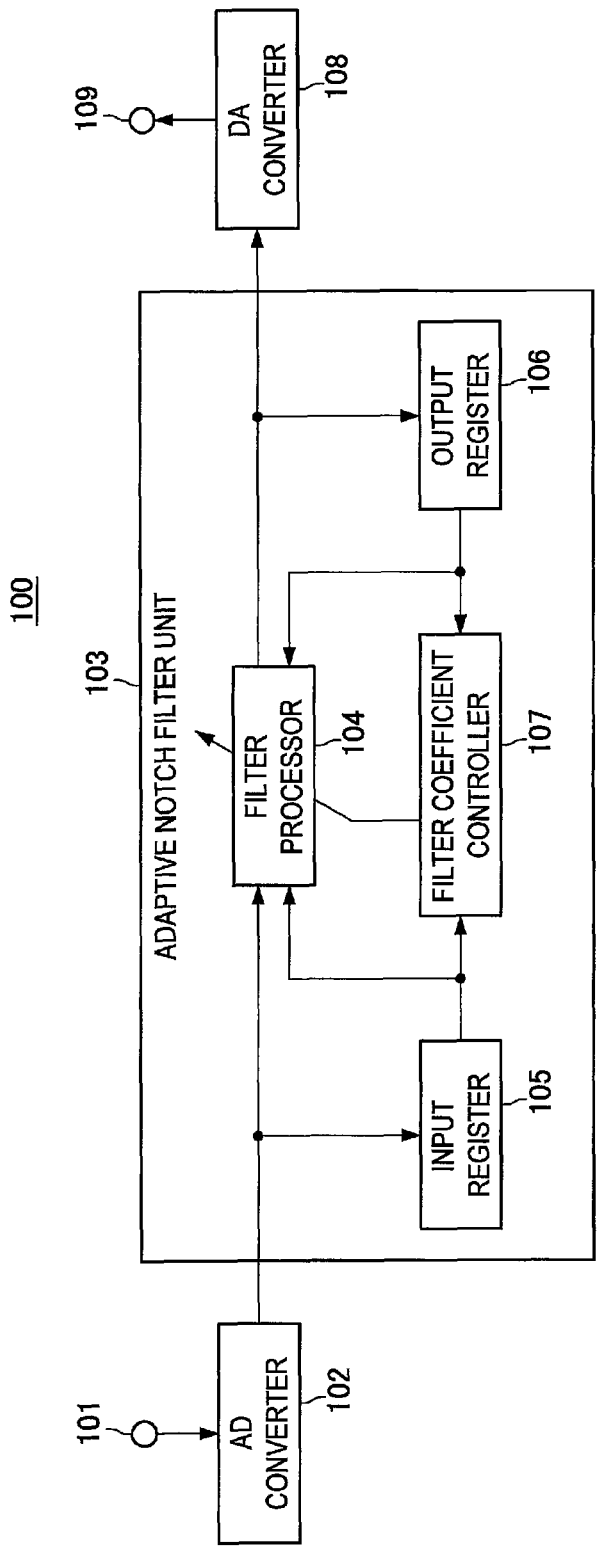
FIG. 3 is a block diagram illustrating an exemplary configuration of a howling suppression device according to the first embodiment.

FIG. 3 is a block diagram illustrating an exemplary configuration of the howling suppression device according to the first embodiment. The respective components that process a digital signal may also be configured as a CPU and program that the CPU executes. Even in this case, the configuration can still be expressed functionally as in FIG. 3.

In FIG. 3, an howling suppression device 100 of the first embodiment includes an audio signal input terminal 101 into which an analog audio signal is input, an AD converter 102 that converts the analog audio signal input into the audio signal input terminal 101 into a digital audio signal, an adaptive notch filter unit 103 that accepts the digital audio signal output from the AD converter 102 as an input signal and performs an adaptive notch filter process, a DA converter 108 that converts a digital audio signal output from the adaptive notch filter unit 103 into an analog audio signal, and an audio signal output terminal 109 that outputs the analog audio signal.

The adaptive notch filter unit 103 is the portion corresponding to the adaptive notch filter of the first embodiment discussed earlier. The adaptive notch filter unit 103 includes a filter processor 104 that accepts the digital audio signal output from the AD converter 102 as an input signal and performs the adaptive notch filter process, an input register 105 that can store the input signal to be supplied to the filter processor 104 in samples equal to the filter length, an output register 106 that can store the output signal from the filter processor 104 in samples equal to the filter length, and a filter coefficient controller 107 that calculates filter coefficients from the input/output signals being stored in the input register 105 and the output register 106.

Figure 4:
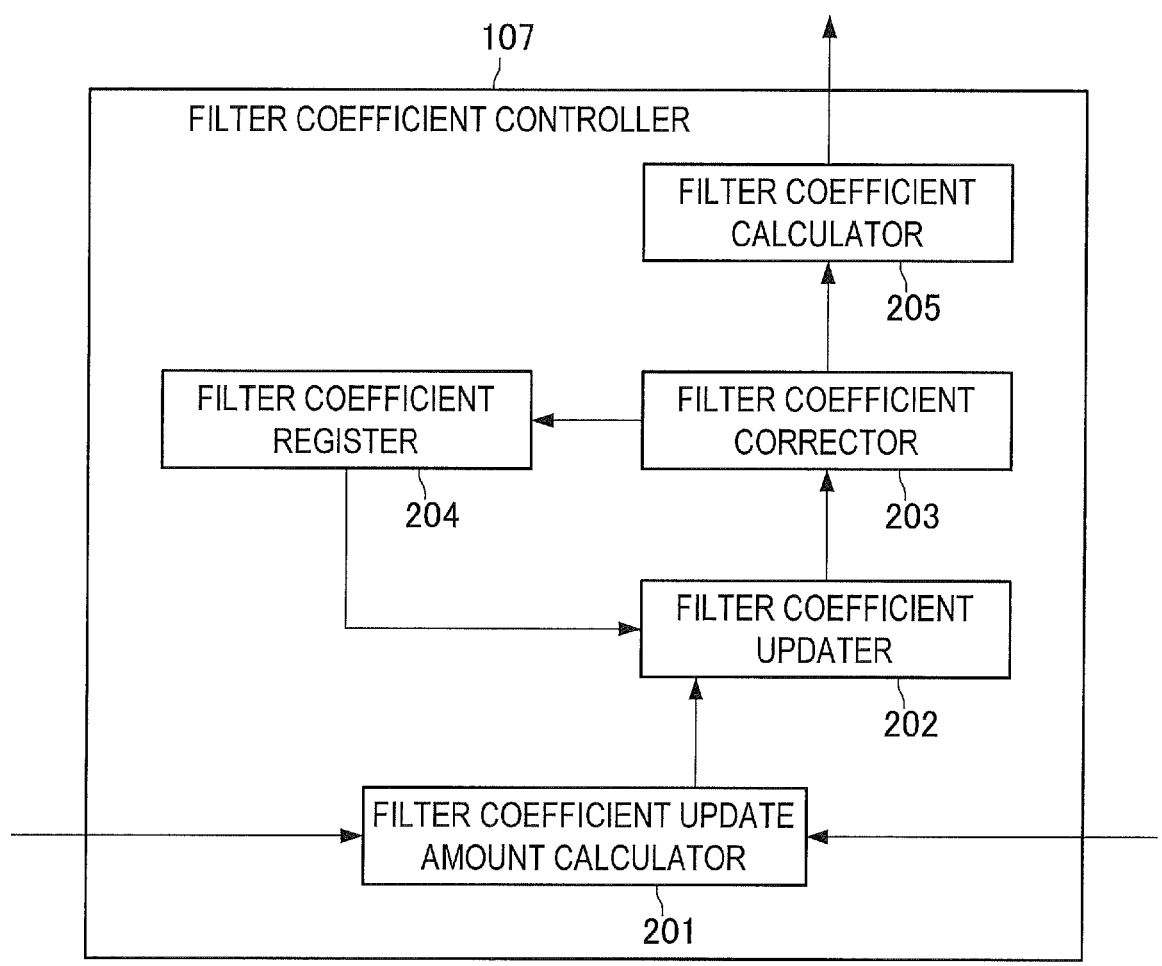
FIG. 4 is a block diagram illustrating an exemplary detailed configuration of a filter coefficient controller in the howling suppression device according to the first embodiment.

FIG. 4 is a block diagram illustrating an exemplary detailed configuration of the filter coefficient controller 107. The filter coefficient controller 107 includes a filter coefficient update amount calculator 201 that calculates the filter coefficient update amounts $\Delta_{a2}$ and $\Delta_{b1}$ using the filter coefficient update algorithm such as Equation (12) and Equation (13) from stored signal in the input register 105 and the output register 106, a filter coefficient updater 202 that updates the filter coefficients $a_2(n)$ and $b_1(n)$ using the filter coefficient update amounts in the filter coefficient update amount calculator 201 according to Equation (10) and Equation (11), a filter coefficient corrector 203 that checks whether or not one of the updated filter coefficients, $a_2(n+1)$, is a value greater than 0 and less than 1, corrects the value to be greater than 0 and less than 1 in the case where the value is less than or equal to 0, or equal to or greater than 1 and outputs the filter coefficients $a_2(n+1)$ and $b_1(n+1)$, a filter coefficient register 204 that stores the filter coefficients $a_2(n+1)$ and $b_1(n+1)$ output from the filter coefficient corrector 203, and supplies these filter coefficients to the filter coefficient updater 202, and a filter coefficient calculator 205 that calculates $b_1(n)\sqrt{(a_2(n))}$ in Equation (9) from the updated filter coefficients, and outputs all filter coefficients.

(C-2) Operation of Howling Suppression Device According to First Embodiment

Next, an exemplary operation of the howling suppression device 100 according to the first embodiment will be described.

The audio signal input terminal 101 accepts, as an input, an analog audio signal, such as a microphone input signal amplified by a microphone amplifier, a signal obtained by amplifying and adding multiple microphone input signals by an audio mixer, or a signal obtained by an echo canceller cancelling echoes. In the AD converter 102, the analog audio signal input into the audio signal input terminal 101 passes through a low-pass filter (built into the AD converter 102) having a passband set according a sampling frequency, thereby cutting off high-range frequencies to avoid aliasing, and is then converted from an analog audio signal to a digital audio signal. The digital audio signal thus digitized is then output from the AD converter 102, and input into the filter processor 104 and the input register 105 of the adaptive notch filter unit 103.

The filter processor 104 calculates a new output signal from the filter processor 104 ($y(n+1)$ when applying the notation in Equation (13)) using input signals from a previous time which are being stored in the input register 105 (for example, see $x(n-1)$ in Equation (13)), output signals from a previous time being stored in the output register 106 (for example, see $y(n)$ in Equation (13) or Equation (12), and $y(n-2)$ in Equation (12)), and filter coefficients output from the filter coefficient controller 107 (for example, see $a_2(n+1)$ in Equation (10) and $b_1(n+1)$ in Equation (11)), and applying the transfer function $H_f(z)$ in Equation (9). The calculated new output signal is supplied to the output register 106 and the DA converter 108.

Here, when a new digital audio signal sample is input into the input register 105 from the AD converter 102, the oldest saved digital audio signal sample at the end of the input register 105 is deleted, the values in the input register 105 are shifted, and thereafter the new digital audio signal sample is saved at the front of the input register 105.

Also, when the output signal is output from the filter processor 104, the output register 106 deletes the oldest saved output signal sample at the end of the output register 106, the values in the output register 106 are shifted, and the most recently calculated output signal is saved at the front of the output register 106.

Next, an exemplary operation in the filter coefficient controller 107 will be described.

The filter coefficient update amount calculator 201 calculates the filter coefficient update amounts $\Delta_{a2}$ and $\Delta_{b1}$ from the signals stored in the input register 105 and the output register 106 according to Equation (12) and Equation (13).

The filter coefficient updater 202 keeps the constant term in the denominator, the constant term in the numerator, and the second-order coefficient in the numerator of the transfer function indicated in Equation (9) at 1, updates the other filter coefficients $a_2(n+1)$ and $b_1(n+1)$ according to Equation (10) and Equation (11) by using the filter coefficient update amounts $\Delta_{a2}$ and $\Delta_{b1}$ output from the filter coefficient update amount calculator 201, the filter coefficients $a_2(n)$ and $b_1(n)$ stored in the filter coefficient register 204, and a predetermined step gain $\mu$, and outputs the updated filter coefficients to the filter coefficient corrector 203.

Between the updated filter coefficients $a_2(n+1)$ and $b_1(n+1)$, the filter coefficient corrector 203 determines whether or not $a_2(n+1)$ is a value that is greater than 0 and less than 1, and when the value is greater than 0 and less than 1, outputs the filter coefficients $a_2(n+1)$ and $b_1(n+1)$ without correction to the filter coefficient register 204 and the filter coefficient calculator 205. When the updated filter coefficient $a_2(n+1)$ is a value less than or equal to 0 or a value equal to or greater than 1, the filter coefficient corrector 203 corrects the value to be greater than 0 and less than 1 (the corrected value may be predetermined, for example), and outputs the filter coefficients $a_2(n+1)$ and $b_1(n+1)$ to the filter coefficient register 204 and the filter coefficient calculator 205.

The filter coefficient register 204 stores the filter coefficients $a_2(n+1)$ and $b_1(n+1)$ output from the filter coefficient corrector 203.

The filter coefficient calculator 205 calculates $b_1(n)\sqrt{(a_2(n))}$ in Equation (9) using the filter coefficients $a_2(n+1)$ and $b_1(n+1)$, and outputs all filter coefficients to the filter processor 104.

The DA converter 108 converts a digital audio signal (that is the output signal from the filter processor 104 of the adaptive notch filter unit 103) into an analog audio signal, which is thereafter passed through a built-in low-pass filter (built into the DA converter 108) according to a sampling frequency, thereby cutting off high-range frequencies to avoid aliasing. The result is given to the audio signal output terminal 109 as an analog audio signal, and the analog audio signal is output from the audio signal output terminal 109 to a speaker amplifier or communication channel.

Next, an exemplary operation from the start of operation until howling occurs in the howling suppression device 100 of the first embodiment will be described.

When the howling suppression device 100 starts operation, an analog audio signal passes through the audio signal input terminal 101, is converted into a digital audio signal at the AD converter 102, and the digital audio signal is input into the adaptive notch filter unit 103.

If howling does not occur, the digital audio signal is output to the DA converter 108 without suppressing a specific frequency since the filter coefficients of the filter processor 104 have not converged. In the DA converter 108, the digital audio signal output from the adaptive notch filter unit 103 is converted into an analog audio signal, and the analog audio signal is output via the audio signal output terminal 109.

Immediately after a single frequency starts to howl, the filter processor 104 cannot suppress the single frequency since the filter coefficients of the adaptive notch filter have not yet converged on the filter coefficients to suppress the howling frequency, and thus outputs a digital audio signal without suppressing the howling signal to the DA converter 108. The DA converter 108 converts the digital audio signal output from the adaptive notch filter unit 103 into an analog audio signal, and outputs the analog audio signal via the audio signal output terminal 109. As a result, an analog audio signal in which howling is not suppressed is output when the single frequency starts to howl.

The filter coefficient controller 107 calculates the filter coefficient update amount in the filter coefficient update amount calculator 201 on the basis of a filter coefficient update algorithm by using stored signals in the input register 105 and the output register 106, and outputs the calculated filter coefficient update amounts to the filter coefficient updater 202. The filter coefficient updater 202 keeps the constant term in the denominator, the constant term in the numerator, and the highest-order filter coefficient in the numerator of the transfer function indicated in Equation (9) at 1, updates the filter coefficients in Equation (10) and Equation (11) by using the filter coefficient update amounts output from the filter coefficient update amount calculator 201, the filter coefficients in the filter coefficient register 204, and a predetermined step gain, and outputs the updated filter coefficients to the filter coefficient corrector 203. The filter coefficient corrector 203 determines whether or not one of the filter coefficients, $a_2(n+1)$, is a value that is greater than 0 and less than 1, and when the value is greater than 0 and less than 1, outputs $a_2(n+1)$ without correction with $b_1(n+1)$ to the filter coefficient register 204 and the filter coefficient calculator 205. When the updated filter coefficient $a_2(n+1)$ is a value less than or equal to 0 or a value equal to or greater than 1, the filter coefficient corrector 203 corrects the value to be greater than 0 and less than 1, and outputs $a_2(n+1)$ with $b_1(n+1)$ to the filter coefficient register 204 and the filter coefficient calculator 205. The filter coefficient calculator 205 calculates $b_1(n)\sqrt{(a_2(n))}$ in Equation (9) by using the filter coefficients output from the filter coefficient corrector 203, and outputs all filter coefficients to the filter processor 104.

As updating proceeds, the filter coefficients of the adaptive notch filter in the filter processor 104 converge on filter coefficients to suppress the howling frequency, and thus a digital audio signal with suppressed howling is output from the adaptive notch filter unit 103 to the DA converter 108. In the DA converter 108, the digital audio signal with suppressed howling output from the adaptive notch filter unit 103 is converted into an analog audio signal with suppressed howling, and the analog audio signal is output via the audio signal output terminal 109. The update amounts calculated in the filter coefficient update amount calculator 201 of the filter coefficient controller 107 become approximately 0 since the output signal from the adaptive notch filter unit 103 becomes approximately 0 (output signal becomes 0 since the howling is suppressed) and the filter coefficients converge without being updated in the filter coefficient updater 202. Thus, the converged state of the filter coefficients is maintained, and howling of a single frequency continues to be suppressed.

When a different frequency starts to howl from the above state, the filter coefficients of the adaptive notch filter in the filter processor 104 cannot suppress the howling signal since the filter coefficients have not converged on the different frequency to suppress the started howling, and outputs a digital audio signal without suppressing the howling to the DA converter 108. In the DA converter 108, the digital audio signal output from the adaptive notch filter unit 103 is converted into an analog audio signal, and the analog audio signal is output via the audio signal output terminal 109. As a result, the analog audio signal in which howling is not suppressed is output when the different frequency howling starts to occur.

The filter coefficient controller 107 calculates the filter coefficient update amount in the filter coefficient update amount calculator 201 on the basis of a filter coefficient update algorithm by using stored signals in the input register 105 and the output register 106, and outputs the calculated filter coefficient update amounts to the filter coefficient updater 202. The filter coefficient updater 202 keeps the constant term in the denominator, the constant term in the numerator, and the highest-order filter coefficient in the numerator of the transfer function indicated in Equation (9) at 1, updates the filter coefficients in Equation (10) and Equation (11) by using the filter coefficient update amounts output from the filter coefficient update amount calculator 201, the filter coefficients in the filter coefficient register 204, and the predetermined step gain, and outputs the updated filter coefficients to the filter coefficient corrector 203. The filter coefficient corrector 203 determines whether or not one of the filter coefficients, $a_2(n+1)$, is a value that is greater than 0 and less than 1, and when the value is greater than 0 and less than 1, outputs $a_2(n+1)$ without correction with $b_1(n+1)$ to the filter coefficient register 204 and the filter coefficient calculator 205. When the updated filter coefficient $a_2(n+1)$ is a value less than or equal to 0 or a value equal to or greater than 1, the filter coefficient corrector 203 corrects the value to be greater than 0 and less than 1, and outputs $a_2(n+1)$ with $b_1(n+1)$ to the filter coefficient register 204 and the filter coefficient calculator 205. The filter coefficient calculator 205 uses the filter coefficients output from the filter coefficient corrector 203 to calculate $b_1(n)\sqrt{(a_2(n))}$ in Equation (9), and outputs all filter coefficients to the filter processor 104.

As updating proceeds, the filter coefficients of the adaptive notch filter in the filter processor 104 once again converge on the filter coefficients to suppress the different frequency, and thus a digital audio signal with suppressed howling is output from the adaptive notch filter unit 103 to the DA converter 108. In the DA converter 108, the digital audio signal output from the adaptive notch filter unit 103 is converted into an analog audio signal with suppressed howling, and the analog audio signal is output via the audio signal output terminal 109. In the filter coefficient controller 107, the update amounts calculated by the filter coefficient update amount calculator 201 of the filter coefficient controller 107 become approximately 0, and the filter coefficients output from the filter coefficient controller 107 converge without being updated since the filter coefficients are not updated in the filter coefficient updater 202 since the output signal from the adaptive notch filter unit 103 becomes approximately 0 (the output signal becomes 0 since the howling of the different frequency is suppressed). Thus, the converged state of the filter coefficients is maintained and the different frequency continues to be suppressed.

When a frequency having a bandwidth starts to howl (not only a particular frequency but also the frequency components near that frequency howl), the adaptive notch filter in the filter processor 104 cannot suppress the howling signal since the filter coefficients have not converged on filter coefficients to suppress the frequency having a bandwidth and thus outputs a digital audio signal without suppressing the howling to the DA converter 108. When the howling starts to occur on the frequency having the bandwidth, the digital audio signal output from the adaptive notch filter unit 103 is converted into an analog audio signal and the analog audio signal is output via the audio signal output terminal 109.

The filter coefficient controller 107 calculates the filter coefficient update amount in the filter coefficient update amount calculator 201 on the basis of a filter coefficient update algorithm by using stored signals in the input register 105 and the output register 106, and outputs the calculated filter coefficient update amounts to the filter coefficient updater 202. The filter coefficient updater 202 keeps the constant term in the denominator, the constant term in the numerator, and the highest-order filter coefficient in the numerator of the transfer function indicated in Equation (9) at 1, updates the filter coefficients in Equation (10) and Equation (11) by using the filter coefficient update amounts output from the filter coefficient update amount calculator 201, the filter coefficients in the filter coefficient register 204, and the predetermined step gain, and outputs the updated filter coefficients to the filter coefficient corrector 203. The filter coefficient corrector 203 determines whether or not one of the filter coefficients, $a_2(n+1)$, is a value that is greater than 0 and less than 1, and when the value is greater than 0 and less than 1, outputs $a_2(n+1)$ without correction with $b_1(n+1)$ to the filter coefficient register 204 and the filter coefficient calculator 205. When the updated filter coefficient $a_2(n+1)$ is a value less than or equal to 0 or a value equal to or greater than 1, the filter coefficient corrector 203 corrects the value to be greater than 0 and less than 1, and outputs $a_2(n+1)$ with $b_1(n+1)$ to the filter coefficient register 204 and the filter coefficient calculator 205. When a frequency having a bandwidth is howling, the output signal is still large and the update amounts also become large even with such an updating process, and convergence of the filter coefficients slows. As a result, the updating of filter coefficients continues for a long time. The filter coefficient calculator 205 uses the filter coefficients output from the filter coefficient corrector 203 to calculate $b_1(n)/(a_2(n))$ in Equation (9), and outputs all filter coefficients to the filter processor 104.

Nevertheless, as updating proceeds, the filter coefficients of the adaptive notch filter in the filter processor 104 converge on filter coefficients to suppress the frequency having the bandwidth, and thus a digital audio signal with suppressed howling is output from the adaptive notch filter unit 103 to the DA converter 108. In the DA converter 108, the digital audio signal output from the adaptive notch filter unit 103 is converted into an analog audio signal, and the analog audio signal is output via the audio signal output terminal 109. In the filter coefficient controller 107, the update amounts calculated by the filter coefficient update amount calculator 201 of the filter coefficient controller 107 become approximately 0, and the filter coefficients output from the filter coefficient controller 107 converge without being updated in the filter coefficient updater 202 since the output signal from the adaptive notch filter unit 103 becomes approximately 0 (the output signal becomes 0 since the frequency having the bandwidth is suppressed howling on the frequency having the bandwidth is suppressed to 0). Thus, the converged state of the filter coefficients is maintained and the frequency having the bandwidth continues to be suppressed.

(C-3) Advantageous Effects of Howling Suppression Device According to First Embodiment According to the howling suppression device of the first embodiment, it is possible to suppress howling in an environment where a single frequency is howling, the howling frequency changes, and the howling frequency has a bandwidth.

(D) Howling Suppression Device According to Second Embodiment

Next, a howling suppression device according to the second embodiment of the present invention will be described with reference to the drawings.

The howling suppression device of the second embodiment implements the adaptive notch filter (a multi-stage adaptive notch filter) of the second embodiment discussed earlier, and conducts an adaptive notch filter process on an input signal to suppress a plurality of howling frequencies even in an environment where the frequencies are howling.

Figure 5:
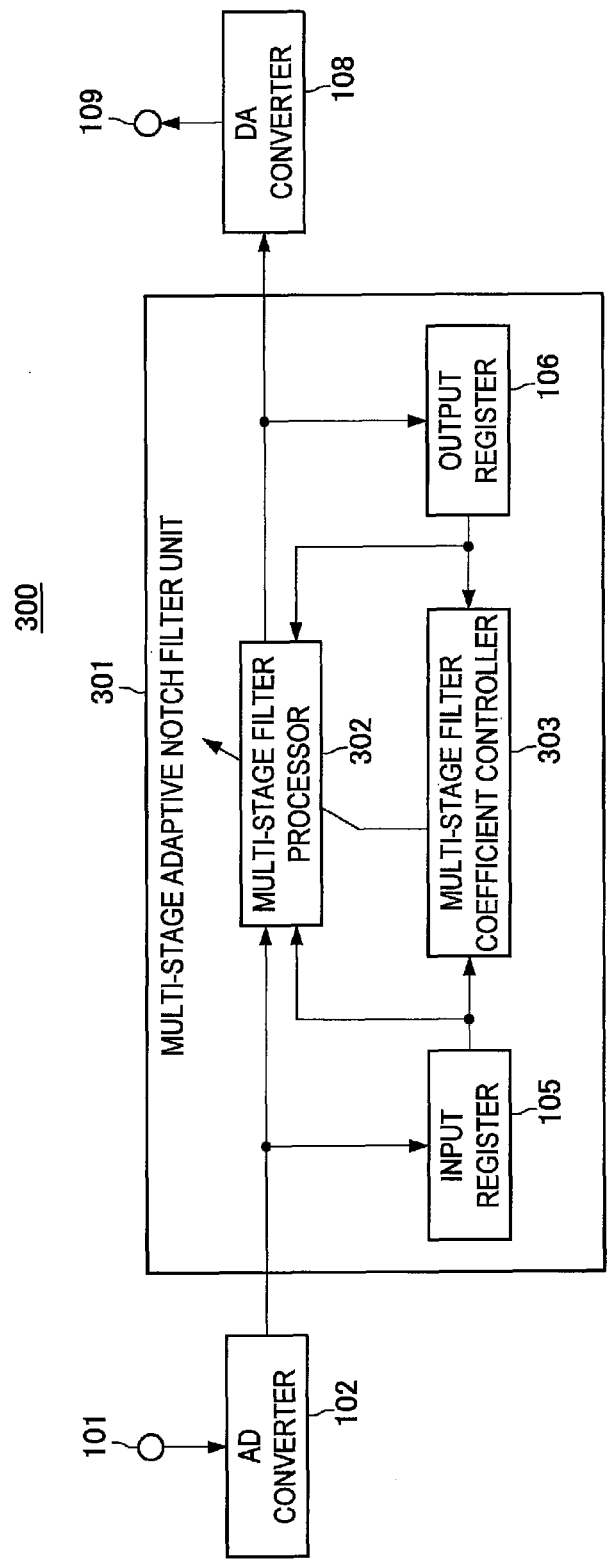
FIG. 5 is a block diagram illustrating an exemplary configuration of a howling suppression device according to the second embodiment.

(D-1) Configuration of Howling Suppression Device According to Second Embodiment FIG. 5 is a block diagram illustrating an exemplary configuration of a howling suppression device according to the second embodiment. Those parts that are the same as/corresponding to those parts in the howling suppression device of the first embodiment shown in FIG. 3 are designated by the same reference numerals. The respective components that process a digital signal may also be configured as a CPU and a program that the CPU executes. Even in this case, the configuration can still be expressed functionally as in FIG. 5.

In FIG. 5, the howling suppression device 300 of the second embodiment includes the audio signal input terminal 101 into which an analog audio signal is input, the AD converter 102 that converts the analog audio signal input into the audio signal input terminal 101 into a digital audio signal, a multi-stage adaptive notch filter unit 301 that accepts the digital audio signal from the AD converter 102 as an input and performs an adaptive notch filter process (an adaptive notch filter of the second embodiment), the DA converter 108 that converts a digital audio signal output from the multi-stage adaptive notch filter unit 301 into an analog audio signal, and the audio signal output terminal 109 that outputs the analog audio signal.

The multi-stage adaptive notch filter unit 301 includes a multi-stage filter processor 302 that accepts the digital audio signal output from the AD converter 102 as an input signal and performs the adaptive notch filter process indicated in Equation (26), an input register 105 that can store the input signal to be supplied to the multi-stage filter processor 302 in samples equal to the filter length, an output register 106 that can store the output signal from the multi-stage filter processor 302 in samples equal to the filter length, and a multi-stage filter coefficient controller 303 that calculates filter coefficients from the stored signals in the input register 105 and the output register 106.

Figure 6:
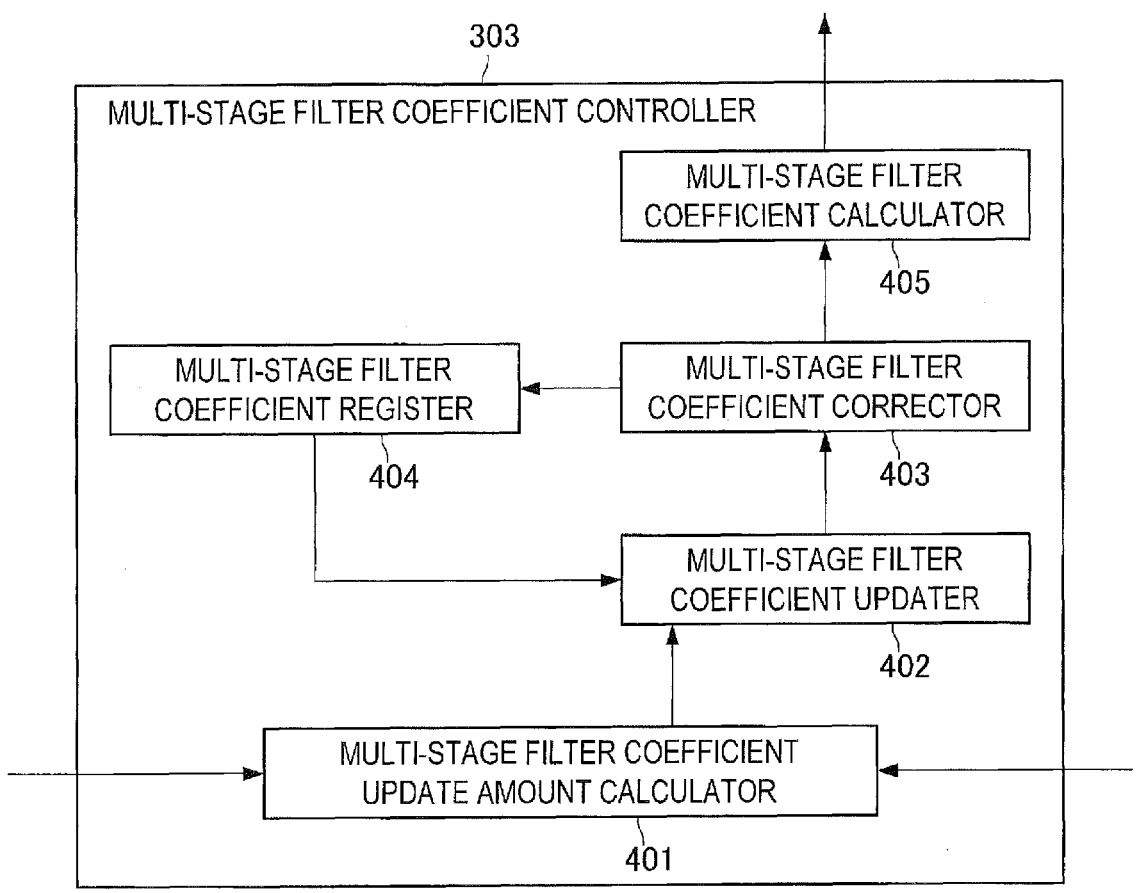
FIG. 6 is a block diagram illustrating an exemplary detailed configuration of a multi-stage filter coefficient controller in a howling suppression device according to the second embodiment.

FIG. 6 is a block diagram illustrating an exemplary detailed configuration of the multi-stage filter coefficient controller 303. The multi-stage filter coefficient controller 303 includes a multi-stage filter coefficient update amount calculator 401 that calculates the filter coefficient update amount using a multi-stage filter coefficient update algorithm such as Equation (24) and Equation (25) from the stored signals in the input register 105 and the output register 106, a multi-stage filter coefficient updater 402 that updates the filter coefficient using the filter coefficient update amounts using the filter coefficient update amount in the multi-stage filter coefficient update amount calculator 401 according to Equation (22) and Equation (23), a multi-stage filter coefficient corrector 403 that checks whether or not one of the updated filter coefficients, $a(n+1)$, is a value greater than 0 and less than 1, corrects the value to be greater than 0 and less than 1 in the case where the value is less than or equal to 0, or equal to or greater than 1, and thus outputs the updated filter coefficients, a multi-stage filter coefficient register 404 that stores the filter coefficients output from the multi-stage filter coefficient corrector 403, and a multi-stage filter coefficient calculator 405 calculates $a_0 b_1(n)$, $a_0^2 b_2(n)$, and $a_0^{2j-1} b_{2j-1}(n)$ in Equation

(20) and $a_0$ in Equation (21) from the updated filter coefficients, and outputs all filter coefficients.

(D-2) Operation of Howling Suppression Device According to Second Embodiment Next, an exemplary operation of a howling suppression device 300 according to the second embodiment will be described. Note that the components with the same reference numerals as in the first embodiment still execute the same operations in the second embodiment.

The multi-stage filter processor 302 calculates a new output signal from the multi-stage filter processor 302 (y(n) in Equation (26)) using the stored signals in the input register 105 (such as x(n), x(n−i), and x(n−2j) in Equation (26), for example), the stored signals in the output register 106 (such as y(n−i) and y(n−2j) in Equation (26), for example), and filter coefficients output from the multi-stage filter coefficient controller 303 (such as $b_i(n)$, a(n), and $a_0(n)$ in Equation (26), for example). The calculated output signal y(n) is supplied to the output register 106 and the DA converter 108.

Next, components in the multi-stage filter coefficient controller 303 will be described.

The multi-stage filter coefficient update amount calculator 401 calculates the multi-stage filter coefficient update amounts $\Delta_a$ and $\Delta_{bi}$ from the stored signals in the input register 105 and the output register 106.

The multi-stage filter coefficient updater 402 keeps the constant term in the denominator, the constant term in the numerator, and the highest-order coefficient in the numerator of the transfer function indicated in Equation (20) at 1, updates the other filter coefficients a(n+1) and $b_i(n+1)$ according to Equation (22) and Equation (23) by using the filter coefficient update amounts output from the multi-stage filter coefficient update amount calculator 401, the filter coefficients in the multi-stage filter coefficient register 404, and a predetermined step gain, and outputs the updated filter coefficients to the multi-stage filter coefficient corrector 403.

The multi-stage filter coefficient corrector 403 determines whether or not the updated filter coefficient a(n+1) is a value that is greater than 0 and less than 1, and when the value is greater than 0 and less than 1, outputs a(n+1) without correction with the other updated filter coefficients to the multi-stage filter coefficient register 404 and the multi-stage filter coefficient calculator 405. When the updated filter coefficient a(n+1) is a value less than or equal to 0, or a value equal to or greater than 1, the multi-stage filter coefficient corrector 403 corrects the value to be greater than 0 and less than 1 (the corrected value may be determined in advance, for example), and outputs a(n+1) with the other updated filter coefficients to the multi-stage filter coefficient register 404 and the multi-stage filter coefficient calculator 405.

The multi-stage filter coefficient register 404 stores the filter coefficients output from the multi-stage filter coefficient corrector 403.

The multi-stage filter coefficient calculator 405 calculates $a_0 b_1(n)$, $a_0^2 b_2(n)$, and $a_0^{2j-1} b_{2j-1}(n)$ using the updated filter coefficients output from the multi-stage filter coefficient corrector 403 in Equation (20) and $a_0$ in Equation (21), and outputs them to the multi-stage filter processor 302.

In the howling suppression device 300 according to the second embodiment, the operation since the operation starts until howling occurs, the operation when a signal containing howling on a single frequency is input, the operation when the howling frequency changes, and the operation when a frequency having a bandwidth is input, are similar to the operations of the howling suppression device 100 according to the first embodiment.

When a plurality of frequencies start to howl, the multi-stage adaptive notch filter in the multi-stage filter processor 302 cannot suppress the plurality of frequencies since the filter coefficients have not converged on filter coefficients to suppress the plurality of frequencies, and thus outputs a howling digital audio signal without suppressing the howling to the DA converter 108. In the DA converter 108, the digital audio signal output from the multi-stage adaptive notch filter unit 301 is converted into an analog audio signal and the analog audio signal is output via the audio signal output terminal 109. As a result, the analog audio signal in which howling is not suppressed is output when howling starts to occur on the plurality of frequencies.

The multi-stage filter coefficient controller 303 calculates the filter coefficient update amount in the multi-stage filter coefficient update amount calculator 401 on the basis of a filter coefficient update algorithm by using stored signals in the input register 105 and the output register 106 to calculate filter coefficient update amounts and outputs the calculated filter coefficient update amounts to the multi-stage filter coefficient updater 402. The multi-stage filter coefficient updater 402 keeps the constant term in the denominator, the constant term in the numerator, and the highest-order filter coefficient in the numerator of the transfer function indicated in Equation (20) at 1, updates the filter coefficients in Equation (22) and Equation (23) by using the filter coefficient update amounts output from the multi-stage filter coefficient update amount calculator 401, the filter coefficients in the multi-stage filter coefficient register 404, and a predetermined step gain, and outputs the updated filter coefficients to the multi-stage filter coefficient corrector 403. The multi-stage filter coefficient corrector 403 determines whether or not one of the updated filter coefficients, a(n+1), is a value that is greater than 0 and less than 1, and when the value is greater than 0 and less than 1, outputs a(n+1) without correction with the other updated filter coefficients to the multi-stage filter coefficient register 404 and the multi-stage filter coefficient calculator 405. When the filter coefficient a(n+1) is a value less than or equal to 0, or a value equal to or greater than 1, the multi-stage filter coefficient corrector 403 corrects the value to be greater than 0 and less than 1, and outputs a(n+1) with the other updated filter coefficients to the multi-stage filter coefficient register 404 and the multi-stage filter coefficient calculator 405. When not much time has elapsed since the start of updating, the output signal from the multi-stage adaptive notch filter unit 301 is still large, and as a result, the update amounts also become large, and the filter coefficients do not converge. As a result, updating of the filter coefficients continues. The multi-stage filter coefficient calculator 405 calculates the other filter coefficients from the updated filter coefficients, and outputs all filter coefficients to the multi-stage filter processor 302.

As updating proceeds, the filter coefficients of the adaptive notch filter in the multi-stage filter processor 302 converge on the filter coefficients to suppress the plurality of frequencies, and thus a digital audio signal with suppressed howling is output from the multi-stage adaptive notch filter unit 301 to the DA converter 108. In the DA converter 108, the digital audio signal output from the multi-stage adaptive notch filter unit 301 is converted into an analog audio signal, and the analog audio signal is output via the audio signal output terminal 109. In the multi-stage filter coefficient controller 303, the update amounts calculated by the multi-stage filter coefficient update amount calculator 401 become approximately 0, and the filter coefficients converge without being updated in the multi-stage filter coefficient updater 402 since the output signal from the multi-stage adaptive notch filter unit 301 becomes approximately 0. Thus, the converged state of the filter coefficients is maintained, and the plurality of frequencies continues to be suppressed.

When the plurality of frequencies each having a bandwidth start to howl (not only particular frequencies but also the frequency components near those frequencies are howling), the multi-stage adaptive notch filter in the multi-stage filter processor 302 cannot suppress the howling signal since the filter coefficients have not converged on the filter coefficients to suppress the plurality of frequencies, and thus outputs a howling digital audio signal without suppressing the howling to the DA converter 108. In the DA converter 108, the digital audio signal output from the multi-stage adaptive notch filter unit 301 is converted into an analog audio signal and the analog audio signal is output via the audio signal output terminal 109. As a result, the analog audio signal in which howling is not suppressed is output when the plurality of frequencies each having a bandwidth starts to occur.

The multi-stage filter coefficient controller 303 calculates the filter coefficient update amounts in the multi-stage filter coefficient update amount calculator 401 on the basis of a filter coefficient update algorithm by using the stored signals in the input register 105 and the output register 106, and outputs the calculated filter coefficient update amounts to the multi-stage filter coefficient updater 402. The multi-stage filter coefficient updater 402 keeps the constant term in the denominator, the constant term in the numerator, and the highest-order filter coefficient in the numerator of the transfer function indicated in Equation (20) at 1, updates the filter coefficients in Equation (22) and Equation (23) by using the filter coefficient update amounts output from the multi-stage filter coefficient update amount calculator 401, the filter coefficients in the multi-stage filter coefficient register 404, and a predetermined step gain, and outputs the updated filter coefficients to the multi-stage filter coefficient corrector 403. The multi-stage filter coefficient corrector 403 determines whether or not one of the updated filter coefficients, a(n+1), is a value that is greater than 0 and less than 1, and when the value is greater than 0 and less than 1, outputs a(n+1) without correction with the other updated filter coefficients to the multi-stage filter coefficient register 404 and the multi-stage filter coefficient calculator 405. When the filter coefficient a(n+1) is a value less than or equal to 0, or a value equal to or greater than 1, the multi-stage filter coefficient corrector 403 corrects the value to be greater than 0 and less than 1, and outputs a(n+1) with the other updated filter coefficients to the multi-stage filter coefficient register 404 and the multi-stage filter coefficient calculator 405. When not much time has elapsed since the start of updating, the output signal from the multi-stage adaptive notch filter unit 301 is still large, and the update amounts also become large and the filter coefficients do not converge. As a result, updating of filter coefficients continues. The multi-stage filter coefficient calculator 405 calculates the other filter coefficients from the updated filter coefficients, and outputs all filter coefficients to the multi-stage filter processor 302. When the plurality of frequencies each having a bandwidth are howling, the output signal is still large and the update amounts also become large even with such an updating process, and convergence of the filter coefficients slows. As a result, the updating of filter coefficients continues for a long time.

Nevertheless, as updating proceeds, the filter coefficients of the adaptive notch filter in the multi-stage filter processor 302 converge on the filter coefficients to suppress the plurality of frequencies, and thus a digital audio signal with suppressed howling is output from the multi-stage adaptive notch filter unit 301 to the DA converter 108. In the DA converter 108, the digital audio signal output from the multi-stage adaptive notch filter unit 301 is converted into an analog audio signal with suppressed howling, and the analog audio signal is output via the audio signal output terminal 109. In the multi-stage filter coefficient controller 303, the update amounts calculated by the multi-stage filter coefficient update amount calculator 401 become approximately 0, and the filter coefficients converge without being updated by the multi-stage filter coefficient updater 402 since the output signal from the multi-stage adaptive notch filter unit 301 becomes approximately 0. Thus, the converged state of the filter coefficients is maintained, and the plurality of frequencies each having a bandwidth continues to be suppressed.

(D-3) Advantageous Effects of Howling Suppression Device According to Second Embodiment According to the howling suppression device of the second embodiment, it is possible to suppress howling in an environment where a plurality of frequencies are howling, an environment where one or more of the howling frequencies change, and even in an environment where one or more of the howling frequencies have a bandwidth.

(E) Other Embodiments

In the howling suppression devices according to the above-described first and second embodiments, the adaptive notch filter according to the first or second embodiment is applied to the howling suppression device. However, the device to which an adaptive notch filter according to the first or second embodiment may be applied is not limited to a howling suppression device.

Heretofore, preferred embodiments of the present invention have been described in detail with reference to the appended drawings, but the present invention is not limited thereto. It should be understood by those skilled in the art that various changes and alterations may be made without departing from the spirit and scope of the appended claims.

What is claimed is:

1. An adaptive notch filter that can adaptively modify one or more notch frequencies, the adaptive notch filter comprising:

a transfer function equivalent to coupling j stages (where j is a natural number equal to or greater than 1) of adaptive notch filter units each having a transfer function $H_f(z)$ expressed by an equation A1 below and having a different notch frequency, $$H_f(z) = \frac{1 + b_1(n)z^{-1} + z^{-2}}{1 + b_1(n)\sqrt{a_2(n)}\, z^{-1} + a_2(n)z^{-2}} \quad (A1)$$

$$a_2(n+1) = a_2(n) - \mu \cdot \Delta_{a2} \quad (A2)$$

$$b_1(n+1) = b_1(n) + \mu \cdot \Delta_{b1} \quad (A3)$$

wherein, in the equation A1, n is time, and $a_2(n)$ and $b_1(n)$ are filter coefficients updated according to an equation A2 and an equation A3, respectively, the filter coefficient $a_2(n)$ is a filter coefficient related to a notch bandwidth, and in the equation A2 and the equation A3, μ is a step gain, and $\Delta_{a2}$ and $\Delta_{b1}$ are filter coefficient update amounts calculated according to respective filter coefficient update algorithms.

2. A howling suppression device that suppresses one or more howling frequencies by utilizing an adaptive notch filter unit that includes an adaptive notch filter and a filter coefficient controller, the howling suppression device comprising:

the adaptive notch filter according to claim 1 as the adaptive notch filter.

3. The howling suppression device according to claim 2, wherein, when the updated filter coefficient $a_2(n)$ related to the notch bandwidth is less than or equal to 0, or equal to or greater than 1, the filter coefficient controller corrects the filter coefficient $a_2(n)$ to a value greater than 0 and less than 1, and causes the corrected filter coefficient $a_2(n)$ to be reflected in the transfer function $H_f(z)$ of the adaptive notch filter.

* * * * *